(12) United States Patent
Kobayashi et al.

(10) Patent No.: US 7,972,973 B2
(45) Date of Patent: Jul. 5, 2011

(54) METHOD FOR FORMING SILICON OXIDE FILM, PLASMA PROCESSING APPARATUS AND STORAGE MEDIUM

(75) Inventors: Takashi Kobayashi, Amagasaki (JP); Toshihiko Shinozawa, Amagasaki (JP); Yoshiro Abe, Amagasaki (JP); Junichi Kitagawa, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 117 days.

(21) Appl. No.: 12/443,137

(22) PCT Filed: Sep. 28, 2007

(86) PCT No.: PCT/JP2007/069042
§ 371 (c)(1),
(2), (4) Date: Mar. 26, 2009

(87) PCT Pub. No.: WO2008/038788
PCT Pub. Date: Apr. 3, 2008

(65) Prior Publication Data
US 2010/0093186 A1    Apr. 15, 2010

(30) Foreign Application Priority Data
Sep. 29, 2006    (JP) .................................. 2006-267743

(51) Int. Cl.
*H01L 21/31* (2006.01)
*H01L 21/469* (2006.01)
*C23C 14/00* (2006.01)
*C23C 8/36* (2006.01)

(52) U.S. Cl. ...... 438/772; 118/50; 148/222; 257/E21.24

(58) Field of Classification Search .................. 438/772, 438/771, 769; 257/E21.24, E21.285; 118/50; 148/222
See application file for complete search history.

(56) References Cited

U.S. PATENT DOCUMENTS
6,975,018 B2 * 12/2005 Ohmi et al. ........... 257/E21.219
(Continued)

FOREIGN PATENT DOCUMENTS
JP    2002-261091    9/2002
(Continued)

OTHER PUBLICATIONS
International Search Report.
(Continued)

*Primary Examiner* — Walter L Lindsay, Jr.
(74) *Attorney, Agent, or Firm* — Smith, Gambrell & Russell, LLP

(57) ABSTRACT

The present invention provides a method for forming a silicon oxide film, with a substantially uniform film thickness and without being so influenced by dense sites and scattered sites in a pattern provided on an object to be processed, while keeping advantageous points of a plasma oxidation process performed under a lower-pressure and lower-oxygen-concentration condition. In this method, plasma of a processing gas is applied to a surface of the object having a concavo-convex pattern, in a processing chamber of a plasma processing apparatus, so as to oxidize silicon on the surface of the object, thereby forming the silicon oxide film. The plasma is generated under the condition that a ratio of oxygen in the processing gas is within a range of 0.1% to 10% and pressure is within a range of 0.133 Pa to 133.3 Pa. This plasma oxidation process is performed, with a plate, having a plurality of through-holes formed therein, being provided between a region for generating the plasma in the processing chamber and the object to be processed.

12 Claims, 7 Drawing Sheets

U.S. PATENT DOCUMENTS

2008/0000551 A1 1/2008 Sato et al.
2008/0146041 A1* 6/2008 Sasaki .......................... 438/772

FOREIGN PATENT DOCUMENTS

| JP | 2005-303074 | 10/2005 |
| JP | 2006/156995 | 6/2006 |
| JP | 2006-156995 | 6/2006 |
| WO | 2004/008519 | 1/2004 |
| WO | 2006/082730 | 8/2006 |

OTHER PUBLICATIONS

PCT Notification of Transmittal of Translation of the International Preliminary Examination Report (Form PCT/IB/338) dated Jan. 2004.

PCT International Preliminary Report on Patentability (Form PCT/IB/373) dated Jan. 2004.

PCT Written Opinion of the International Searching Authority (Form/ISA/237) dated Apr. 2005.

* cited by examiner

METHOD FOR FORMING SILICON OXIDE FILM, PLASMA PROCESSING APPARATUS AND STORAGE MEDIUM

BACKGROUND OF THE INVENTION

1. Field of the Invention

The present invention relates to a method for forming a silicon oxide film, a plasma processing apparatus and a storage medium, and in particular relates to the method for forming the silicon oxide film, plasma processing apparatus and storage medium, each applicable to the case of forming the silicon oxide film used as an insulating film in a process for manufacturing, for example, various semiconductor devices or the like.

2. Background Art

In the process for manufacturing the various semiconductor devices, the silicon oxide film, such as $SiO_2$ or the like, which is used as the insulating film, such as a gate insulating film of, for example, a transistor, is formed. The method for forming such a silicon oxide film can be broadly divided into a thermal oxidation process employing an oxidation furnace and/or RTP (Rapid Thermal Process) apparatus and a plasma oxidation process employing a plasma processing apparatus. For instance, in a wet oxidation process using the oxidation furnace, which is one aspect of the heating process, a silicon substrate or substrates are first heated up to a temperature above 800° C., and then exposed to an oxidizing atmosphere in a WVG (Water Vapor Generator) apparatus adapted for generating steam ($H_2O$) by combusting hydrogen with oxygen. In this manner, the surface of each silicon substrate can be oxidized, thereby forming the silicon oxide film thereon.

Meanwhile, in the plasma oxidation process, a processing gas containing an argon gas and an oxygen gas is used, with an approximately 1% flow rate of oxygen. Specifically, this plasma oxidation process is performed by applying plasma, which has been generated in a chamber under pressure of 133.3 Pa while being excited by a microwave, to each silicon surface. As used herein, such plasma excited by the microwave will be referred to as "microwave excitation plasma." This process can facilitate control of film thickness and form the silicon oxide film having relatively high quality (see, e.g., Patent Document 1).

Patent Document 1: WO2004/008519

Recently, the thermal oxidation process has been considered as a method that can form the silicon oxide film with higher quality. However, this process should be performed at a considerably high temperature exceeding 800° C. Therefore, this thermal oxidation process may cause an oxidation rate to be excessively elevated and hence unduly increase the film thickness, thus making it quite difficult to control the film thickness, especially in the case of forming a highly thin film. For instance, each corner portion of the silicon surface having a concavo-convex shape may tend to be conspicuously rounded, and it is difficult to control a degree of increase of the film thickness in such a rounded portion. Furthermore, such a thermal oxidation process is likely to increase thermal budget and have negative impact, such as deformation or warp, on each silicon substrate, due to thermal stress.

Meanwhile, the plasma oxidation process described in the above Patent Document 1 is performed at a relatively low temperature of approximately 400° C., thereby substantially avoiding such undesired increase of the thermal budget and warp of each substrate that may be caused by the above thermal oxidation process. In addition, due to the plasma process performed under the condition of approximately 1% flow rate of $O_2$ and 133.3 Pa processing pressure (for convenience, such a condition will be, hereinafter, referred to as a "lower-pressure and lower-oxygen-concentration condition"), a significantly high oxidation rate can be achieved. Besides, this plasma oxidation process can successfully control the rounded shape of each corner portion that will be generally formed in the case of oxidizing the silicon surface having the concavo-convex shape. Moreover, this plasma oxidation process can achieve formation of a highly thin silicon oxide film on the surface having such a concavo-convex shape, leading to positive suppression against occurrence of a leak current from such a surface.

However, when the plasma oxidation process is performed under the lower-pressure and lower-oxygen-concentration condition as described above and if a pattern formed on a surface of an object to be processed includes dense sites and scattered sites, such as closely aggregated lines, relatively opened spaces and the like, partial pressure of oxygen tends to be lowered in each dense site, resulting in a difference in a rate of formation of the silicon oxide film, between such dense sites and scattered sites in the pattern. Therefore, the thickness of the oxide film formed on the silicon is likely to be thinned in each dense site, as such making it difficult to form the silicon oxide film, with a uniform film thickness. Additionally, such variations in the film thickness in particular sites of the silicon oxide film formed on the silicon surface having the concavo-convex shape may tend to cause serious degradation of reliability of the semiconductor device having this silicon oxide film as the insulating film thereof.

SUMMARY OF THE INVENTION

Therefore, it is an object of the present invention to provide a new method for forming the silicon oxide film on a concavo-convex surface, with a substantially uniform film thickness and without being so influenced by the pattern provided on the surface, while keeping advantageous points of the plasma oxidation process performed under the lower-pressure and lower-oxygen-concentration condition.

The present invention is a method for forming a silicon oxide film, comprising the steps of: placing an object formed of silicon and having a concavo-convex pattern on a surface thereof, in a processing chamber of a plasma processing apparatus; and forming a silicon oxide film by generating plasma of a processing gas so as to oxidize the silicon on the surface of the object to be processed, and by applying the plasma of the processing gas to the surface, thereby wherein the step of forming the silicon oxide film comprises generating the plasma under the condition that a ratio of oxygen in the processing gas is within a range of 0.1% to 10% and pressure is within a range of 0.133 Pa to 133.3 Pa, so as to oxidize the silicon, and introducing the generated plasma toward the object to be processed, via a plurality of through-holes formed in a member provided between a region for generating the plasma in the processing chamber and the object to be processed, thereby forming the silicon oxide film.

In the method for forming the silicon oxide film, according to the present invention, the ratio of oxygen in the processing gas is within a range of 0.5% to 10%.

In the method for forming the silicon oxide film, according to the present invention, the processing pressure is within a range of 6.6 Pa to 133.3 Pa.

In the method for forming the silicon oxide film, according to the present invention, the processing gas further contains hydrogen at a ratio within a range of 0.1% to 10%.

In the method for forming the silicon oxide film, according to the present invention, the processing temperature is within a range of 200° C. to 800° C., upon forming the silicon oxide film by generating the plasma of the processing gas.

In the method for forming the silicon oxide film, according to the present invention, the plasma is microwave excitation plasma generated from the processing gas, with a microwave introduced into the processing chamber, via a transparent plate, from a planar antenna having a plurality of slots.

In the method for forming the silicon oxide film, according to the present invention, a diameter of each through-hole is within a range of 2.5 mm to 12 mm.

In the method for forming the silicon oxide film, according to the present invention, an electron temperature of the plasma, after it passed through the through-holes, is 0.7 eV or less.

In the method for forming the silicon oxide film, according to the present invention, an opening ratio of the through-holes is within a range of 10% to 20%.

In the method for forming the silicon oxide film, according to the present invention, a distance between the object to be processed and the member having the through-holes formed therein is within a range of 3 mm to 20 mm.

In the method for forming the silicon oxide film, according to the present invention, a distance between the member having the through-holes formed therein and the transparent plate is within a range of 20 mm to 50 mm.

Alternatively, the present invention is a plasma processing apparatus, comprising: a processing chamber configured to be evacuated into a vacuum state and adapted for providing a desired process to an object formed of silicon and having a concavo-convex pattern on a surface thereof; a processing gas supply unit adapted for supplying a processing gas into the processing chamber; a plasma supply source adapted for generating plasma of the processing gas in the processing chamber, so as to oxidize the silicon on the surface of the object to be processed, by applying the plasma of the processing gas to the surface, thereby forming the silicon oxide film; an exhaust apparatus adapted for controlling pressure in the processing chamber; and a control unit adapted for controlling the processing gas supply unit, plasma supply source and exhaust apparatus, respectively, wherein a member having a plurality of through-holes formed therein is provided between a region for generating plasma in the processing chamber and the object to be processed for dividing the processing chamber, and wherein the control unit is configured to control the processing gas supply unit, plasma supply source and exhaust apparatus, respectively, thereby to generate the plasma under the condition that a ratio of oxygen in the processing gas is within a range of 0.1% to 10% and pressure is within a range of 0.133 Pa to 133.3 Pa, so as to oxidize the silicon, to introduce the generated plasma toward the object to be processed, via the plurality of through-holes formed in the member, thereby forming the silicon oxide film.

Alternatively, the present invention is a computer-readable storage medium for storing therein a computer program for driving a computer to execute a method for forming a silicon oxide film, wherein the method for forming the silicon oxide film comprises the steps of: placing an object formed of silicon and having a concavo-convex pattern on a surface thereof, in a processing chamber of a plasma processing apparatus; and forming a silicon oxide film by generating plasma of a processing gas, so as to oxidize the silicon on the surface of the object to be processed, and by applying the plasma of the processing gas to the surface, wherein the step of forming the silicon oxide film comprises generating the plasma under the condition that a ratio of oxygen in the processing gas is within a range of 0.1% to 10% and pressure is within a range of 0.133 Pa to 133.3 Pa, so as to oxidize the silicon, and introducing the generated plasma toward the object to be processed, via a plurality of through-holes formed in a member provided between a region for generating the plasma in the processing chamber and the object to be processed, thereby forming the silicon oxide film.

According to the present invention, the plasma is generated under the condition that the ratio of oxygen in the processing gas is within the range of 0.1% to 10% and the pressure is within the range of 0.133 Pa to 133.3 Pa, with the member, having the plurality of through-holes formed therein, being provided between the region for generating plasma in the processing chamber and the object to be processed. In this way, the silicon oxide film having a substantially uniform thickness can be formed, with secure suppression of variations in the film thickness that may be otherwise caused by dense sites and scattered sites included in the pattern provided on the surface of the object, while successfully keeping advantageous points of the plasma oxidation process performed under the lower-pressure and lower-oxygen-concentration condition, including a higher oxidation rate, formation of preferably rounded shoulder portions in the pattern, and the like. Accordingly, excellent electrical properties can be provided to the semiconductor device including the silicon oxide film obtained by this invention, as the insulating film thereof. Additionally, in the method of forming the silicon oxide film according to this invention, the silicon oxide film can be formed, with the substantially uniform film thickness and without being so influenced by the dense sites and scattered sites included in the pattern provided on the surface of the object to be processed. Therefore, the reliability of the semiconductor device having such a silicon oxide film, as the insulating film thereof, can be significantly enhanced.

DETAILED DESCRIPTION OF THE INVENTION

EXAMPLES

Figure 1:
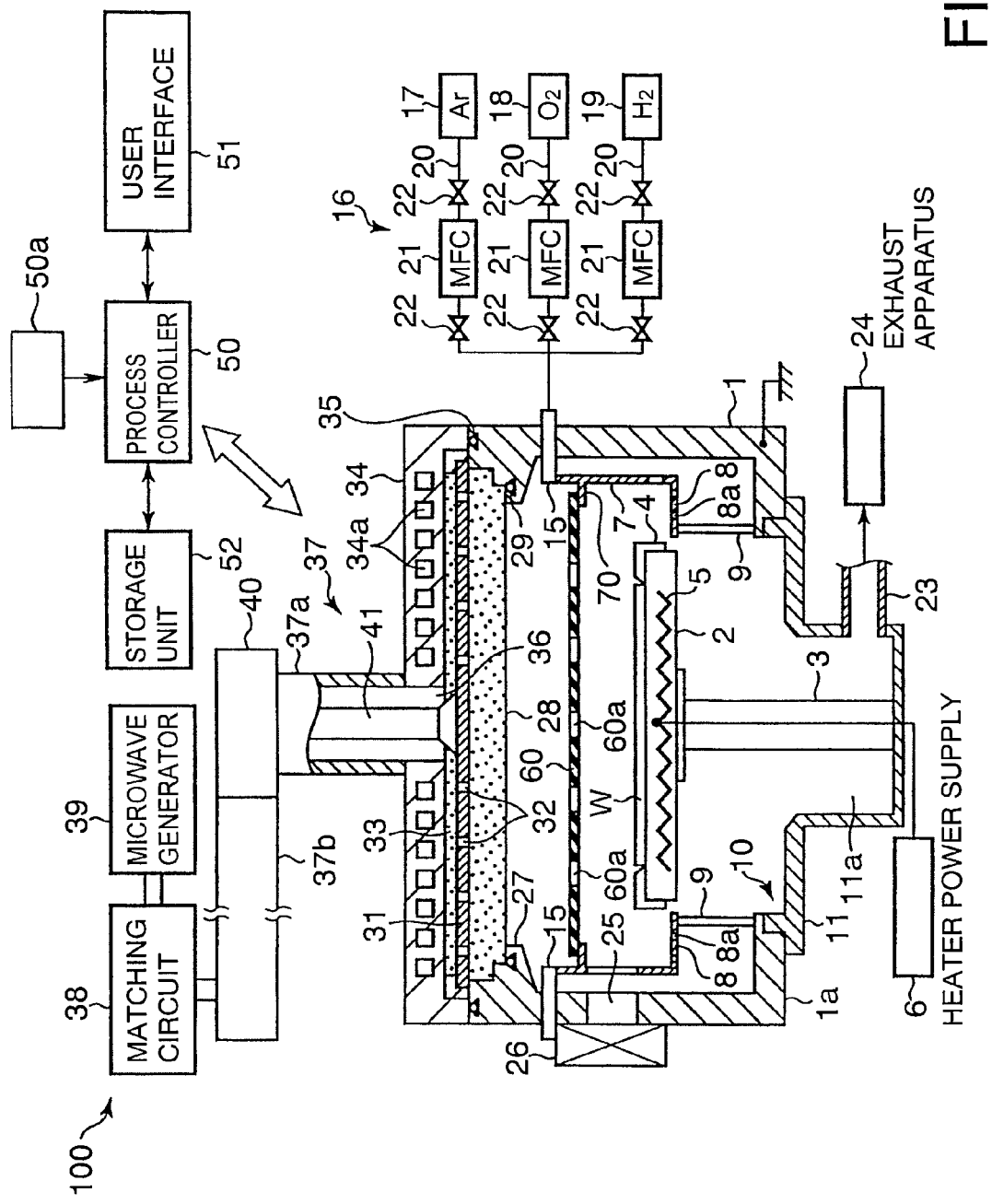
FIG. 1 is a schematic cross sectional view for illustrating one example of a plasma processing apparatus suitable for performing a method according to the present invention.

Hereinafter, one embodiment of the present invention will be described specifically, with reference to the drawings. FIG. 1 is a cross sectional view schematically showing one example of a plasma processing apparatus, which is suitable for performing a method for forming a silicon oxide film related to the present invention. This plasma processing apparatus includes a planar antenna, especially an RLSA (Radial Line Slot Antenna), having a plurality of slots formed therein. This RLSA-microwave-plasma-type processing apparatus is configured for generating plasma by introducing a microwave into a processing chamber via the antenna, thereby to generate microwave excitation plasma of a higher density and a lower electron temperature of, for example, 1.2 eV or lower, in the vicinity of an object to be processed. For instance, this plasma processing apparatus is suitable for forming an insulating film used for various semiconductor devices, such as a gate insulating film for a transistor.

This plasma processing apparatus 100 has a chamber (or processing chamber) 1, which is airtightly sealed and grounded, and has a substantially cylindrical shape. A circular opening 10 is formed in a substantially central portion of a bottom wall 1a of the chamber 1. An exhaust chamber 11, which is communicated with the opening 10 and projected downward, is provided on the bottom wall 1a.

In the chamber 1, a susceptor 2 formed from ceramics, such as AlN or the like, is provided for horizontally supporting a semiconductor wafer (hereinafter, referred to as a "wafer") W that is an object to be processed. The wafer W has a concavo-convex pattern on a surface thereof, and is formed from silicon. The susceptor 2 is supported by a cylindrical support member 3 extending upward from a bottom central portion of the exhaust chamber 11 and formed from ceramics, such as AlN or the like. A guide ring 4 configured for guiding the wafer W is provided around the periphery of the susceptor 2. Additionally, a resistance heater 5 is embedded in the susceptor 2. This heater 5 is adapted for heating the susceptor 2, when supplied with electricity from a heater power supply 6. Therefore, the wafer W that is an object to be processed can also be heated together with the heated susceptor 2. The temperature of the heater 5 can be controlled within a range of, for example, from a room temperature to 1000° C. It is noted that a cylindrical liner 7 formed from quartz is provided along an inner circumference of the chamber 1, while a baffle plate 8 having a plurality of exhaust holes 8a and formed from quartz is annularly provided, around an outer circumference of the susceptor 2, for uniformly evacuating the interior of the chamber 1. The baffle plate 8 is supported by a plurality of struts 9. Thus, the interior of the chamber 1 can be kept in a clean environment, thereby preventing occurrence of metal contamination therein.

A wafer support pin or pins (not shown) are provided in the susceptor 2. Each wafer support pin is configured to be optionally projected from and retracted into a surface of the susceptor 2, thereby to raise and lower the wafer W, while supporting it thereon.

A plate 60 having a plurality of through-holes formed therein is provided above the susceptor 2. The through-holes of the plate 60 are respectively provided for allowing ions, among active species present in the plasma, to pass through the plate 60, while attenuating the energy of the ions by blocking the ions. The plate 60 may be formed from a dielectric of ceramics, such as quartz, sapphire, SiN, SiC, $Al_2O_3$, AlN or the like, or otherwise formed from a silicon single crystal, polysilicon, amorphous silicon or the like. In this embodiment, while high-purity quartz, containing several ten ppm (parts per million) or lower of impurities, is used as a material for the plate 60, any other suitable material, such as silicon nitride, polysilicon, amorphous silicon, single crystal silicon or the like, may also be used, with high purity.

The periphery of the plate 60 is supported by a support member 70 projected inward from the liner 7 over the entire inner circumference of the chamber 1. It is noted that this plate 60 having a plurality of through-holes is provided for attenuating the energy of the active species, such as ions present in the plasma by blocking the ions. Specifically, with the provision of such an energy attenuating plate 60, the electron temperature in the plasma in the vicinity of the wafer can be controlled to 0.7 eV or lower (or less), thereby significantly mitigating damage caused by the plasma.

The plate 60 having a plurality of through-holes is preferably attached in a position near the wafer W. For instance, a distance between a bottom end of the plate 60 and the wafer W is set within a range of 3 to 20 mm, more preferably set at approximately 10 mm. In this case, a distance between a top end of the plate 60 and a bottom end of a transparent plate 28 (which will be described later) is preferably within a range of 20 to 50 mm.

The through-holes designated by 60a are formed in the plate 60. FIGS. 2(a), 2(b) respectively show details of the plate 60. Specifically, FIG. 2(a) shows the plate 60 when it is seen from the above, while FIG. 2(b) illustrates a cross sectional view of a key portion of the plate 60.

The through-holes 60a of the plate 60 are provided, in substantially uniform arrangement, in a region slightly greater than an area corresponding to the wafer W positioned below the plate 60 and depicted by a dotted line in FIG. 2(a). Specifically, as shown in FIG. 2(a), the length L of a circle, corresponding to an outer circumference of the region in which the through-holes 60a are arranged, is slightly greater than a diameter of the wafer W of, for example, a 300 mm-diameter size. More specifically, the length L of the circle, in which the through-holes 60a are arranged, is greater, by approximately 5 to 30 mm, than the diameter of the wafer W. It is noted that the through-holes 60a may be arranged in the entire body of the plate 60.

Each of the through-holes 60a may have any suitable diameter D1. For instance, the diameter D1 can be set at, for example, approximately 2.5 mm, 5 mm or 10 mm. In addition, the size of each through-hole 60a may be changed, depending on the position thereof in the plate 60. However, if the diameter D1 of each through-hole 60a is unduly small, the radicals would be less likely to pass therethrough. Contrary, if the diameter D1 is too large, an effect of attenuating radicals would not be obtained adequately, resulting in such a state that there are no through-holes 60a. In view of such conditions, it is preferred that the diameter D1 is set within a range of 2 to 5 mm. In regard to the arrangement of the through-holes 60a, any given arranging manner, such as a concentric, radial, spiral or the like manner, can be selected. In view of mechanical strength required for installment, the thickness T1 of the plate 60 is preferably within a range of approximately 2 to 20 mm, more preferably about 3 to 8 mm.

As described above, the plate 60 serves as a means for attenuating the energy of the active species, such as ions present in the plasma.

Namely, the plate 60 formed of a suitable dielectric and having such a structure as described above can serve to allow mainly the radicals present in the plasma to pass therethrough, while attenuating the energy of ions, for example, Ar ions, $O_2^+$ ions and the like, each having relatively high energy. To this end, as will be described later, it is preferred that an opening area of the through-holes 60a in the plate 60, the diameter D1 of each through-hole 60a, a shape and/or arrangement of the through-hole 60a, thickness T1 of the plate 60 (or height of a wall 60a thereof), a position for installment of the plate 60 (or distance from the wafer W) are considered, collectively. For instance, in the case in which the diameter of each through-hole 60a is set within a range of 2.5 to 12 mm, a ratio of the total opening area of the through-holes 60a, relative to a surface area of the wafer W, in the region of the plate 60 corresponding to the wafer W, is preferably 10 to 50%.

An annular gas introducing member 15 is provided through a side wall of the chamber 1. A gas supply system 16 is connected with the gas introducing member 15. It is noted that the gas introducing member 15 may be provided to introduce a gas into the chamber 1, like a shower. The gas supply system 16 includes, for example, an Ar gas supply source 17, an $O_2$ gas supply source 18 and an $H_2$ gas supply source 19. Thus, such gases can be first supplied to the gas introducing member 15 via gas lines 20, and then introduced into the chamber 1 from the gas introducing member 15, respectively. On each of the gas lines 20, a mass flow controller 21 and opening and closing valves 22 located on both sides of the controller 21 are provided. It is noted that any other suitable rare gas, such as Kr, He, Xe or the like, may be used, in place of using the Ar gas to securely generate plasma.

An exhaust pipe 23 is connected with a side wall of the exhaust chamber 11. An exhaust apparatus 24 including a high-pumping-speed vacuum pump is connected with the exhaust pipe 23. With actuation of the exhaust apparatus 24, the gas present in the chamber 1 can be uniformly evacuated into a space 11a of the exhaust chamber 11, and then discharged to the outside via the exhaust pipe 23. In this way, the pressure in the chamber 1 can be rapidly reduced up to a predetermined degree of vacuum, e.g., 0.133 Pa.

To the side wall of the chamber 1, a transfer port 25 and a gate valve 26 adapted for opening and closing the transfer port 25 are further provided. The transfer port 25 is configured for allowing the wafer W to be transferred between the plasma processing apparatus 100 and a carrier chamber (not shown) located adjacent to the apparatus 100.

An opening is provided in an upper portion of the chamber 1, and a ring-like support portion 27 is provided around the opening. On the support portion 27, a microwave transparent plate 28, which is formed of a dielectric of ceramics, such as quartz, $Al_2O_3$ or the like, and is transparent to the microwave, is airtightly provided via a sealing member 29. Thus, the interior of the chamber 1 can be kept in an airtightly sealed state.

Figure 3:
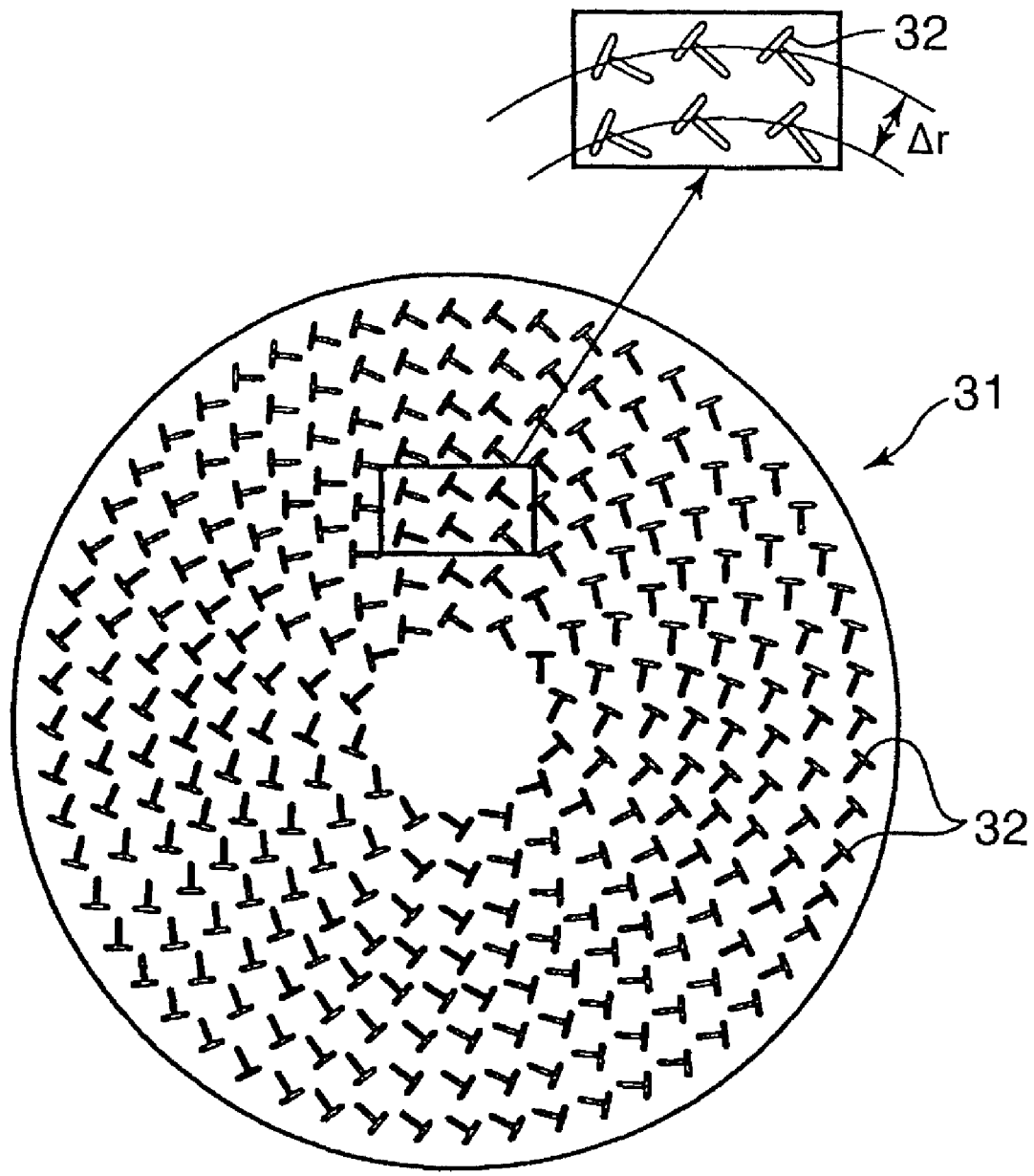
FIG. 3 is a diagram showing a structure of a planar antenna plate.

A disk-like planar antenna plate 31 is provided, above the transparent plate 28, to be opposed to the susceptor 2. The planar antenna plate 31 is locked onto an upper end of the side wall of the chamber 1. The planar antenna plate 31 is formed of an electrically conductive material, such as a copper plate or aluminum plate having a surface plated with, for example, silver or gold. In such a planar antenna plate 31, multiple microwave radiation holes 32 are formed, respectively in pairs, with a predetermined pattern, through the plate 31. Each microwave radiation hole 32 has, for example, an elongated groove-like shape as shown in FIG. 3, and each pair of the microwave radiation holes 32 which are adjacent to each other are typically arranged in a T-like shape. Furthermore, such multiple T-shaped pairs of microwave radiation holes 32 are arranged concentrically. It should be appreciated that the length of each microwave radiation hole 32 and an interval between adjacent lines in the concentric arrangement of the holes 32 are determined, respectively, depending on the wavelength ($\lambda g$) of the microwave used. For instance, the interval between the concentric lines of the microwave radiation holes 32 is set to be $\lambda g/4$, $\lambda g/2$ or $\lambda g$. In FIG. 3, such an interval between the adjacent lines in the concentric arrangement of the microwave radiation holes 32 is designated by $\Delta r$.

It is noted that each microwave radiation hole 32 may have any other suitable shape, such as a circle, an arc and the like. Furthermore, it is noted that the arrangement of the microwave radiation holes 32 is not limited in particular to such concentric arrangement as described above. For instance, these holes 32 may also be provided in spiral or radial arrangement.

On a top face of the planar antenna plate 31, a retardation member 33 is provided, which is formed of, for example, quartz or resin, such as polytetrafluoroethylene, polyimide or the like, having a dielectric constant greater than that of vacuum. Generally, the wavelength of the microwave is increased in the vacuum. Thus, the retardation member 33 is used to positively shorten such a wavelength of the microwave, so as to properly control the plasma. In the drawing, while the planar antenna plate 31 is depicted to be closely contacted with the transparent plate 28 and the retardation member 33 is also depicted to be in close contact with the planar antenna plate 31, these plates and member may be suitably spaced apart from one another.

On a top face of the chamber 1, a shield cover 34 is provided to cover the planar antenna plate 31 and retardation member 33. The shield cover 34 is formed from a metallic material, such as aluminum, stainless steel or the like. This shield cover 34 serves as a part of a waveguide passage, and is adapted for uniformly propagating the microwave. The top face of the chamber 1 and shield cover 34 are sealed with a sealing member 35. In the shield cover 34, a cooling-water flow passage 34a is formed, so that the shield cover 34, retardation member 33, planar antenna plate 31 and transparent plate 28 can be cooled together, with cooling water flowed through the passage 34a. It is noted that the shield cover 34 is grounded.

An opening 36 is formed in a central portion of a top wall of the shield cover 34. This opening is in communication with a waveguide 37. To one end of the waveguide 37 opposite to the opening, a microwave generator 39 is connected via a matching circuit 38. Thus, the microwave of, for example, a 2.45 GHz frequency, generated from the microwave generator 39 can be propagated to the planar antenna plate 31 via the waveguide 37. It is noted that the frequency, such as 8.35 GHz, 1.98 GHz or the like, may also be used as the frequency for the microwave.

The waveguide 37 includes a coaxial waveguide 37a having a circular cross section and extending upward from the opening 36 of the shield cover 34, and a rectangular waveguide 37b connected with a top end of the coaxial waveguide 37a via a mode converter 40 and extending in the horizontal direction. The mode converter 40 provided between the rectangular waveguide 37b and the coaxial waveguide 37a can serve to change the microwave propagated in a TE mode through the rectangular waveguide 37b, into a TEM mode. An internal conductor 41 extends along a central axis of the coaxial waveguide 37a, with a bottom end portion of the internal conductor 41 being connected and fixed to a center of the planar antenna plate 31. As such, the microwave can be propagated, uniformly and efficiently, to the planar antenna plate 31 via the internal conductor 41 of the coaxial waveguide 37a.

Each component of the plasma processing apparatus 100 is connected with and controlled by a process controller 50 provided with a CPU. Further, a user interface 51, including a keyboard for allowing an operator to perform an input operation of commands used for controlling the plasma processing apparatus 100, a display adapted for visualizing and displaying operational conditions of the plasma processing apparatus 100, and the like, is connected with the process controller 50.

Furthermore, a storage unit 52 is connected to the process controller 50 for storing therein control programs (or software) for performing various processes in the plasma processing apparatus 100 under control of the process controller 50 and/or recipes, on which data concerning process conditions and the like are written.

Thus, a desired process can be performed, as needed, in the plasma processing apparatus 100, under the control of the process controller 50, by reading any given suitable recipe from the storage unit 52 and driving the process controller 50 to execute the recipe, in response to an inputted command or the like from the user interface 51. In regard to the recipes for the control programs and/or data concerning the process conditions, those stored in a computer-readable storage medium 50a, such as a CD-ROM, a hard disk, a flexible disk, a flash memory and the like, can be utilized. Otherwise, such recipes are also available, online, by transmitting them, at any time, from another apparatus, via a dedicated line.

In short, the plasma processing apparatus 100 constructed as described above can achieve a substantially uniformed plasma process, and thus form a significantly high quality film, while suppressing occurrence of undesired damage of the film, even under a relatively low temperature condition of, for example, 800° C. or lower, more preferably 500° C. or lower.

For example, the plasma processing apparatus 100 is well applicable to the case of forming the silicon oxide film or silicon nitride film used as the gate insulating film for the transistor or forming a silicon oxide-nitride film by nitriding the silicon oxide film, as well as applicable to the case of forming a similar oxide film in a trench for the so-called STI (Shallow Trench Isolation) technique utilized as a device separation technique in a process for manufacturing the semiconductor device.

Next, a method for forming the silicon oxide film by using the plasma processing apparatus 100 will be discussed. First, the gate valve 26 is opened. Then, the wafer W formed from silicon and having recesses, such as trenches, formed therein is carried from the transfer port 25 into the chamber 1, and is placed on the susceptor 2. Thereafter, the Ar gas, $O_2$ gas and the like are introduced into the chamber 1, via the gas introducing member 15, from the Ar gas supply source 17, $O_2$ gas supply source 18 and the like of the gas supply system 16, at predetermined flow rates, respectively. Then, the pressure in the chamber 1 and the temperature of the susceptor 2 are respectively controlled to be matched with a selected process condition. Under the selected process condition, the ratio of oxygen in the processing gas is preferably within a range of, for example, 0.1 to 10%, more preferably 0.5 to 10%, and more preferably 0.5 to 5%. Further, in the processing gas, the flow rate of the Ar gas is set within a range of 10 to 5000 mL/min, while the flow rate of the $O_2$ gas is set within a range of 1 to 500 mL/min, wherein these flow rates can be selected, respectively, such that the ratio of oxygen relative to the total gas flow rate will be within the above range.

Preferably, the processing pressure is within a range of 0.133 to 133.3 Pa, more preferably 6.6 to 133.3 Pa.

The processing temperature can be selected from a range of 200° C. to 800° C., and is preferably within a range of 400° C. to 500° C.

Further, an $H_2$ gas can be introduced into the chamber 1, from the $H_2$ gas supply source 19, at a predetermined ratio, in addition to the Ar gas and $O_2$ gas respectively introduced from the Ar gas supply source 17 and $O_2$ gas supply source 18. With the supply of the $H_2$ gas, an oxidation rate in the plasma oxidation process can be significantly enhanced.

This is because OH radicals that can directly contribute to the enhancement of the oxidation rate can be adequately produced by such supply of the $H_2$ gas. In this case, the ratio of the $H_2$ gas, relative to the total amount of the processing gas, is within a range of 0.1 to 10%, preferably 0.1 to 5%, and more preferably 0.1 to 2%.

Subsequently, the microwave generated from the microwave generator 39 is introduced into the waveguide 37 through the matching circuit 38. Then, the microwave is supplied to the planar antenna plate 31 through the rectangular waveguide 37b, mode converter 40 and coaxial waveguide 37a, successively. Thereafter, the microwave is radiated toward a space above the wafer W in the chamber 1 through the microwave transparent plate 28 from the planar antenna 31. In this case, the microwave is propagated in the TE mode through the rectangular waveguide 37b, and then changed into the TEM mode by the mode converter 40. Thereafter, the microwave is propagated toward the planar antenna 31 through the coaxial waveguide 37a. Preferably, the power of the microwave generator 39 is set within a range of 0.41 to 4.19 $W/cm^2$, or a range of 0.5 to 5 kW.

As a result, an electromagnetic field is created in the chamber 1, due to the microwave radiated into the chamber 1 through the microwave transparent plate 28 from the planar antenna plate 31. Thus, the Ar gas, $O_2$ gas and the like are changed into plasma, then the silicon surface exposed to the outside in each recess formed in the wafer W is oxidized by the so-generated plasma. This microwave excitation plasma has relatively high density of approximately $1 \times 10^{10}$ to $5 \times 10^{12}/cm^3$, because such a microwave is radiated from the multiple microwave radiation holes 32 of the planar antenna plate 31. Besides, the electron temperature of the plasma is as low as approximately 1.5 eV or less in the vicinity of the wafer W. Accordingly, such microwave excitation plasma exerts, in nature, less damage due to ions or the like, on the silicon oxide film, while the energy of such ions or the like in the plasma can be positively attenuated by blocking the ions when the plasma passes through the plate 60 toward the space above the wafer W. Therefore, in the space below the plate 60, the electron temperature of the plasma will be lowered to 1 eV or less, especially lowered up to 0.7 eV or less in the vicinity of the wafer W, resulting in a very mild plasma condition to the oxide film formed on the wafer W.

With such control of the energy of the plasma by the plate 60 having the trough-holes 60a between the wafer W and the microwave transparent plate 20 which can block the ions, oxygen can be properly introduced into the silicon, by an effect of active species, mainly consisting of $O(^1D_2)$ radicals or the like, having passed through the plate 60, thereby adequately forming Si—O bonds therein. Consequently, an excellent silicon oxide film can be formed, with higher density and quality including fewer traps. Additionally, a desired silicon oxide film, having substantially uniform film thickness and properly rounded corner portions on the concavoconvex surface thereof, can be obtained.

Figure 4:
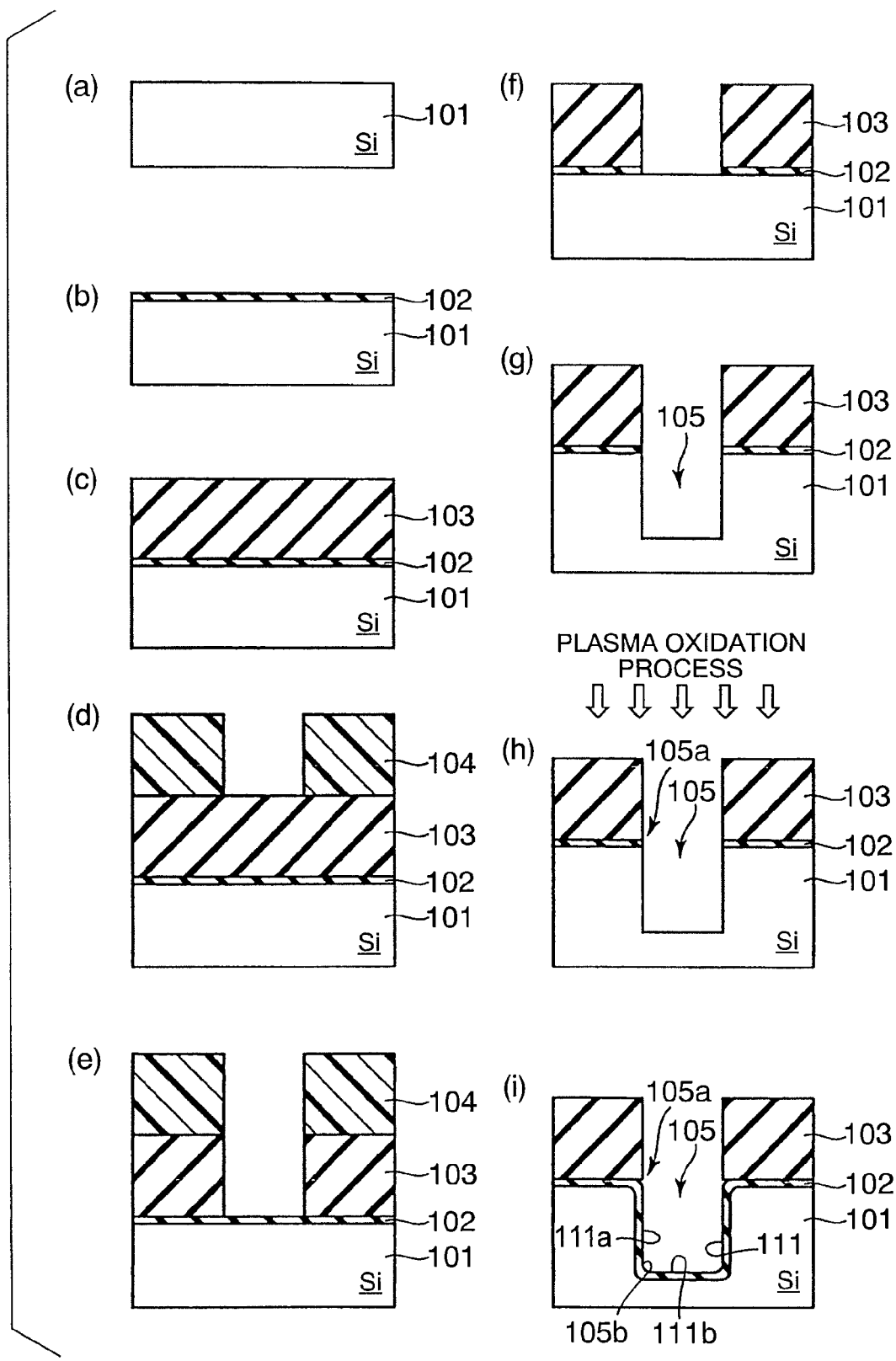
FIGS. 4(a) to 4(i) are schematic diagrams, respectively illustrating one example of application to device separation for STI.

Referring now to FIG. 4, one example, in which the method for forming the silicon oxide film related to the present invention is applied to formation of an oxide film in one exemplary trench for the STI, will be discussed. FIGS. 4(a) to 4(i) are schematic diagrams, respectively illustrating an exemplary procedure for forming the trench for the STI and then forming the oxide film therein.

First, as shown in FIGS. 4(a) and 4(b), a typical silicon oxide film 102, such as $SiO_2$ or the like, is formed on a silicon substrate 101, by thermal oxidation or the like. Then, as shown in FIG. 4(c), a silicon nitride film 103, such as $Si_3N_4$ or the like, is formed on the silicon oxide film 102, such as by CVD (Chemical Vapor Deposition). Thereafter, as shown in FIG. 4(d), a photoresist is coated on the silicon nitride film 103, and a resist layer 104 is then formed on the silicon nitride film 103, by patterning, in accordance with the photolithography.

Subsequently, the silicon nitride film 103 and silicon oxide film 102 are selectively etched, by using, for example, a fluorocarbon-based etching gas, with the resist layer 104 used as an etching mask. Consequently, the silicon substrate 101 is exposed to the outside, corresponding to the pattern of the resist layer 104 (FIG. 4(e)). As a result, a mask pattern for forming the trench is formed from the silicon nitride film 103. FIG. 4(f) shows a state, in which the resist layer 104 is removed by the so-called ashing process performed with, for example, oxygen containing plasma using a suitable processing gas containing oxygen or the like.

In FIG. 4(g), a typical trench 105 is formed by selectively etching the silicon substrate 101, with the silicon nitride film 103 and silicon oxide film 102 respectively used as a proper mask. This etching can be performed, either by using a halogen or halogen compounds, such as $Cl_2$, HBr, $SF_6$, $CF_4$ or the like, or by using a suitable etching gas containing $O_2$ or the like.

FIG. 4(h) shows a process for forming the silicon oxide film on the trench 105 formed in the wafer W after the etching process for the STI. In this case, the plasma oxidation process is performed under the lower-pressure and lower-oxygen-concentration condition. With the plasma oxidation process performed under such a condition, the silicon material 101 at each shoulder portion 105a as well as at each bottom edge portion 105b of the trench 105 can be successfully rounded. Namely, such a rounded shape, at each of shoulder portions 105a and bottom edge portions 105b of the trench 105, formed by oxidizing the silicon material 101, allows a desired silicon oxide film 111, having the substantially uniform film thickness, to be formed in the trench 105. Thus, occurrence of a leak current can be positively suppressed, as compared with the case in which each of the shoulder portions 105a and bottom edge portions 105b of the trench 105 is formed more acutely. In other words, as shown in FIG. 4(i), silicon oxide films 111a, 111b, respectively having the substantially uniform film thickness, can be formed on inner faces (i.e., (110) and (100) faces) of the trench 105, without surface orientation dependent properties in the formation of the silicon oxide film. This effect can be considered to be obtained under such a condition that $O(^1D_2)$ radicals are generated, predominantly, in the plasma, in the plasma oxidation process performed under the lower-pressure and lower-oxygen-concentration condition.

After the silicon oxide film 111 is formed by the method for forming the silicon oxide film according to the present invention, the insulating film, such as $SiO_2$, is formed or embedded in the trench 105, such as by the CVD, in accordance with a procedure of forming a device separation region for the STI. Thereafter, the entire surface is flattened, by polishing, such as CMP (Chemical Mechanical Polishing) or the like method, with the silicon nitride film 103 used as a stopper layer. After this flattening step, the silicon nitride film 103 and an upper portion of the embedded insulating film are removed by etching, thus forming a device separation structure.

Next, a result of a test for checking the effect of the present invention will be described.

Figure 5:
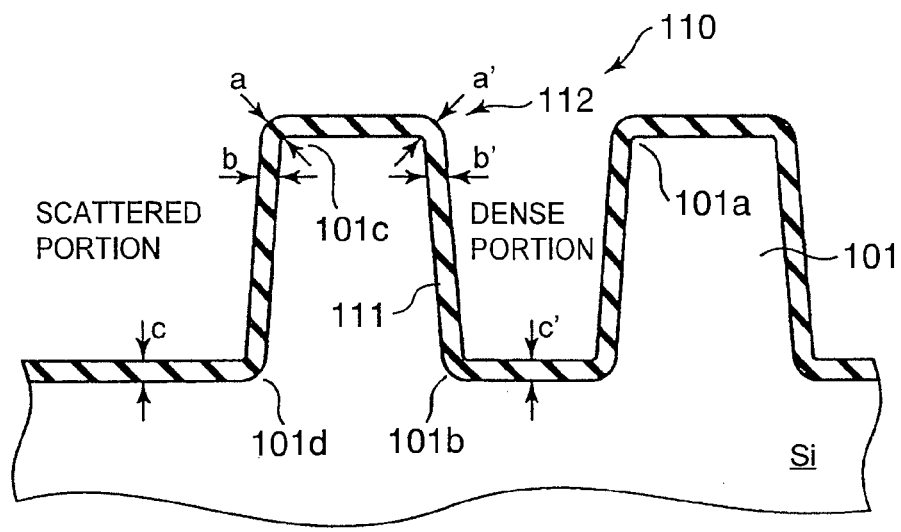
FIG. 5 is a schematic diagram showing a longitudinal cross section of a portion in the vicinity of a wafer surface having a pattern formed thereon.

In this test, the method for forming the silicon oxide film according to the present invention was applied to the formation of the oxide film on the silicon surface, which has a particular pattern formed thereon and including the dense sites and scattered sites, such as closely aggregated lines and opened spaces. FIG. 5 is a schematic diagram showing a cross section of a structure of a key portion of each wafer W, after the oxide film 111 is formed on the silicon substrate 101 having a pattern 110, by the plasma oxidation processes respectively performed under the following conditions A and B.

First, as one embodiment of the present invention, the plasma processing apparatus 100 shown in FIG. 1 was used for performing the plasma oxidation process under the following condition A, so as to form the silicon oxide film. Thereafter, a corner film thickness a of each shoulder portion 112, a side-face film thickness b and a bottom-face film thickness c of a scattered portion (or scattered site) in the pattern 110 as well as the corner film thickness a' of each shoulder portion 112, side-face film thickness b' and bottom-face film thickness c' of a dense portion or rough portion (or dense site or rough site) in the pattern were measured, respectively. Then, as a comparative example, another plasma processing apparatus having the same structure as the plasma processing apparatus 100 shown in FIG. 1, except that the plate 60 was not provided to this apparatus, was used for performing the plasma oxidation process under the following condition B, so as to form the silicon oxide film. Thereafter, each film thickness of the so-formed silicon oxide film was measured in the same manner as in the above embodiment of this invention. It is noted that a ratio between the depth of each recess and the width thereof (i.e., an aspect ratio) in the pattern was 1 at each scattered portion, while 2 at each dense portion.

Then, for the respective silicon oxide films formed as described above, a ratio of the corner film thinness (i.e., (the film thickness a')/(the film thickness b')) and a difference in the film thickness between the dense site and the scattered site in the pattern 110 (i.e., ((the film thickness c')/(the film thickness c))×100) were calculated, respectively. The results of this calculation are shown in Table 1.

(Condition A: Using the Plate 60)
    Flow rate of the Ar gas: 500 mL/min (sccm)
    Flow rate of the $O_2$ gas: 5 mL/min (sccm)
    Flow rate of the $H_2$ gas: 5 mL/min (sccm)
    Ratio of the $O_2$ gas: approximately 1%
    Processing pressure: 133.3 Pa (1 Torr)
    Power of the microwave: 2.3 W/cm$^2$ (2750 W)
    Processing temperature: 400° C.
    Process time: 1800 seconds
    Diameter of each opening of the plate 60: 10 mm
(Condition B: Not Using the Plate 60)
    Flow rate of the Ar gas: 500 mL/min (sccm)
    Flow rate of the $O_2$ gas: 5 mL/min (sccm)
    Ratio of the $O_2$ gas: approximately 1%
    Processing pressure: 133.3 Pa (1 Torr)
    Power of the microwave: 2.3 W/cm$^2$ (2750 W)
    Processing temperature: 400° C.
    Process time: 360 seconds

TABLE 1

|  | Embodiment of this invention (using the plate) | Comparative example (not using the plate) |
| --- | --- | --- |
| Ratio of the corner film thickness (a'/b') | 1.16 | 1.34 |
| Difference in the film thickness between the dense site and the scattered site (c'/c) × 100 [%] | 81.6 | 60.4 |

From Table 1, it can be seen that the ratio of the corner film thickness was 1.16 in the case in which the silicon oxide film was formed by using the plate 60, while the ratio was 1.34 in the case of not using the plate 60. Thus, both of the results can be considered to be within an applicable range. Namely, the ratio of the corner film thickness is typically indicative of a degree of rounding each shoulder portion 112 in the pattern. For instance, this ratio greater than 1.00 demonstrates that the silicon material 101 at each shoulder portion 112 is rounded to some extent.

Meanwhile, the difference in the film thickness between the dense site and the scattered site was 81.6% in the case in which the silicon oxide film was formed by using the plate 60, demonstrating significant enhancement of uniformity in the film thickness, as compared with 60.4% in the case of not using the plate 60.

Accordingly, by forming the silicon oxide film under the lower-pressure and lower-oxygen-concentration condition in the plasma processing apparatus 100 provided with the plate 60, the silicon material 101 at each shoulder portion 112 in the pattern 110 can be adequately rounded, while the difference in the film thickness between the dense site and the scattered site in the pattern can be significantly improved.

Figure 6:
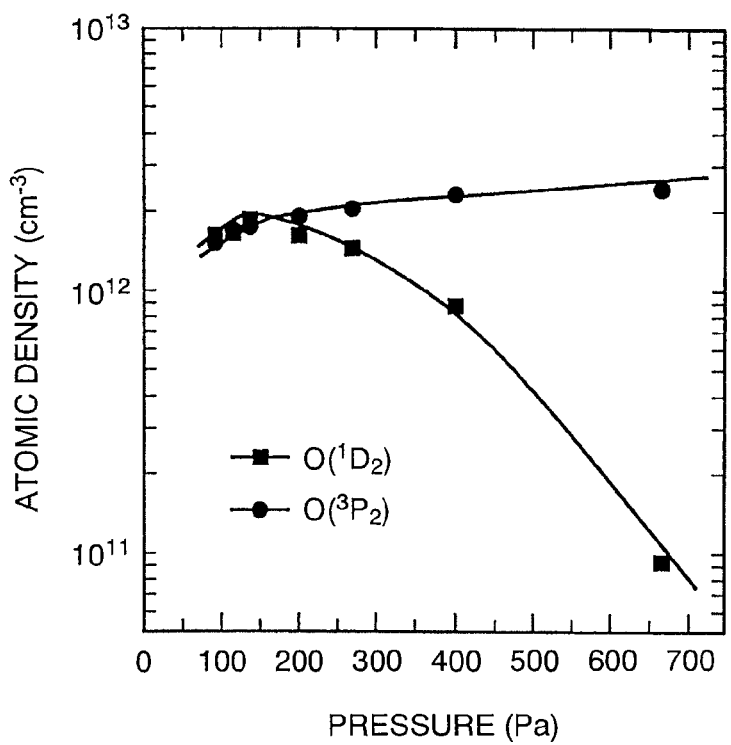
FIG. 6 is a graph showing a relationship between processing pressure and density of radicals (atomic density) in plasma.

FIG. 6 is a graph showing a relationship between the processing pressure and atomic density of radicals, such as $O(^1D_2)$ and $O(^3P_2)$, in the plasma produced in the plasma processing apparatus 100. In this case, the condition for generating the plasma comprises Ar flow rate of 500 mL/min (sccm); $O_2$ flow rate of 5 mL/min (sccm) [with the ratio of the $O_2$ gas being approximately 1%]; processing temperature of 400° C.; and microwave power of 1500 W (1.25 W/cm$^2$), wherein the processing pressure is changed within a range of from 90 to 667 Pa.

From the results shown in FIG. 6, it can be seen that the density of $O(^1D_2)$ may tend to reach its peak value in the vicinity of 133.3 Pa, while being rapidly decreased, with further elevation of the processing pressure, as compared with the density of $O(^3P_2)$.

Figure 7:
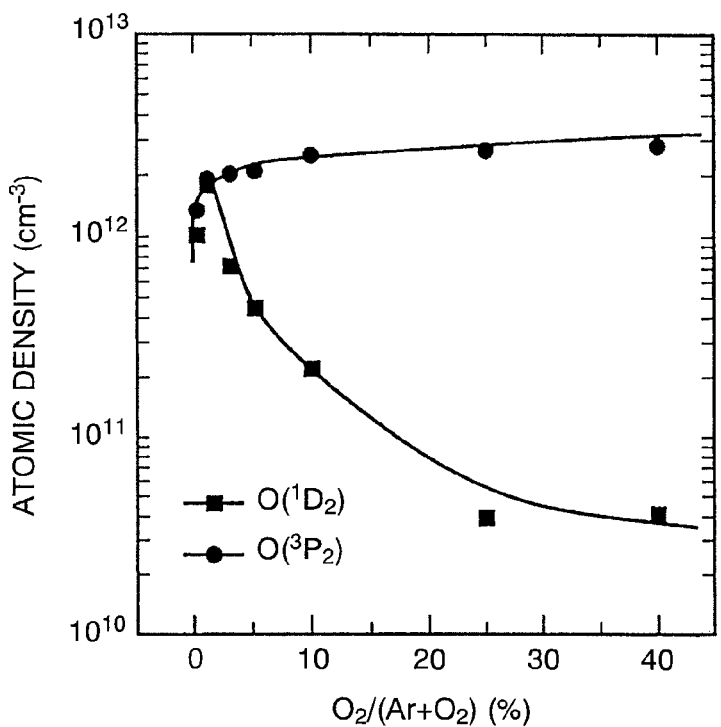
FIG. 7 is a graph showing a relationship between a ratio of a flow rate of a processing gas and the density of the radicals in the plasma.

FIG. 7 is a graph showing a relationship between a ratio of the flow rate of the processing gas and the density of $O(^1D_2)$ and $O(^3P_2)$ in the plasma. In this case, the condition for generating the plasma comprises the processing pressure of 133.3 Pa (1 Torr); processing temperature of 400° C.; microwave power of 1500 W (1.25 W/cm$^2$); Ar flow rate of 300 to 500 mL/min (sccm); and $O_2$ flow rate of 1 to 200 mL/min (sccm), wherein the ratio of the $O_2$ gas flow rate (i.e., ($O_2$/Ar+$O_2$)×100) is changed within a range of 0.2 to 40%.

From FIG. 7, it can be seen that the density of $O(^3P_2)$ is hardly influenced by the change of the ratio of the $O_2$ gas flow rate (i.e., ($O_2$/Ar+$O_2$)×100) in the processing gas, while the density of $O(^1D_2)$ becomes higher as the ratio of the $O_2$ gas flow rate in the processing gas is lowered, with a steep peek in the vicinity of 1% $O_2$ gas flow rate.

From FIGS. 6 and 7, it can be seen that the plasma with substantially the highest density of $O(^1D_2)$ and $O(^3P_2)$ is produced, under the lower-pressure and lower-oxygen-concentration condition of 133.3 Pa pressure and 1% $O_2$ concentration, in the plasma processing apparatus 100 provided with the plate 60 having a plurality of through-holes 60a. With the oxidation of the silicon by using the plasma mainly consisting of such radicals, i.e., $O(^1D_2)$ and $O(^3P_2)$, the adequately rounded portion can be formed at each corner portion 101a, 101c of the shoulder portions 112 as well as at each bottom edge portion 101b, 101d in the pattern 110. Additionally, with the provision of the plate 60 having a plurality of through-holes 60a between the wafer W and the microwave transparent plate 20, most of ions, such as $O_2^+$ ions, $O^+$ ions and the like, among other active species than the aforementioned radicals, present in the plasma and usually involved in the oxidation, can be substantially attenuated by blocking the ions. Meanwhile, the radicals, such as $O(^1D_2)$ and the like, can pass through the through-holes 60a of the plate 60 and reach the surface of the wafer W. As a result, unlike the ions having tendency to vertically penetrate into the surface of the wafer W, the radicals, such as $O(^1D_2)$ and the like, can penetrate, isotropically, into the wafer surface. Thus, the surface of the wafer W will be subjected to the plasma oxidation predominantly caused by such $O(^1D_2)$ radicals and the like. This can be attributed to the aforementioned improvement for the difference in the film thickness between the dense site and the scattered site in the pattern 110.

While one preferred embodiment of the present invention has been discussed above, this invention is not limited in particular to this embodiment, and various modifications and/or alterations can be made thereto without departing from the scope and spirit of this invention. For instance, while the plasma processing apparatus 1 of the RLSA type has been mentioned with reference to FIG. 1, any other suitable type of the plasma processing apparatus, such as an ICP type, ECR type, surface reflected wave type, magnetron type or the like, may also be used herein.

Figure 2:
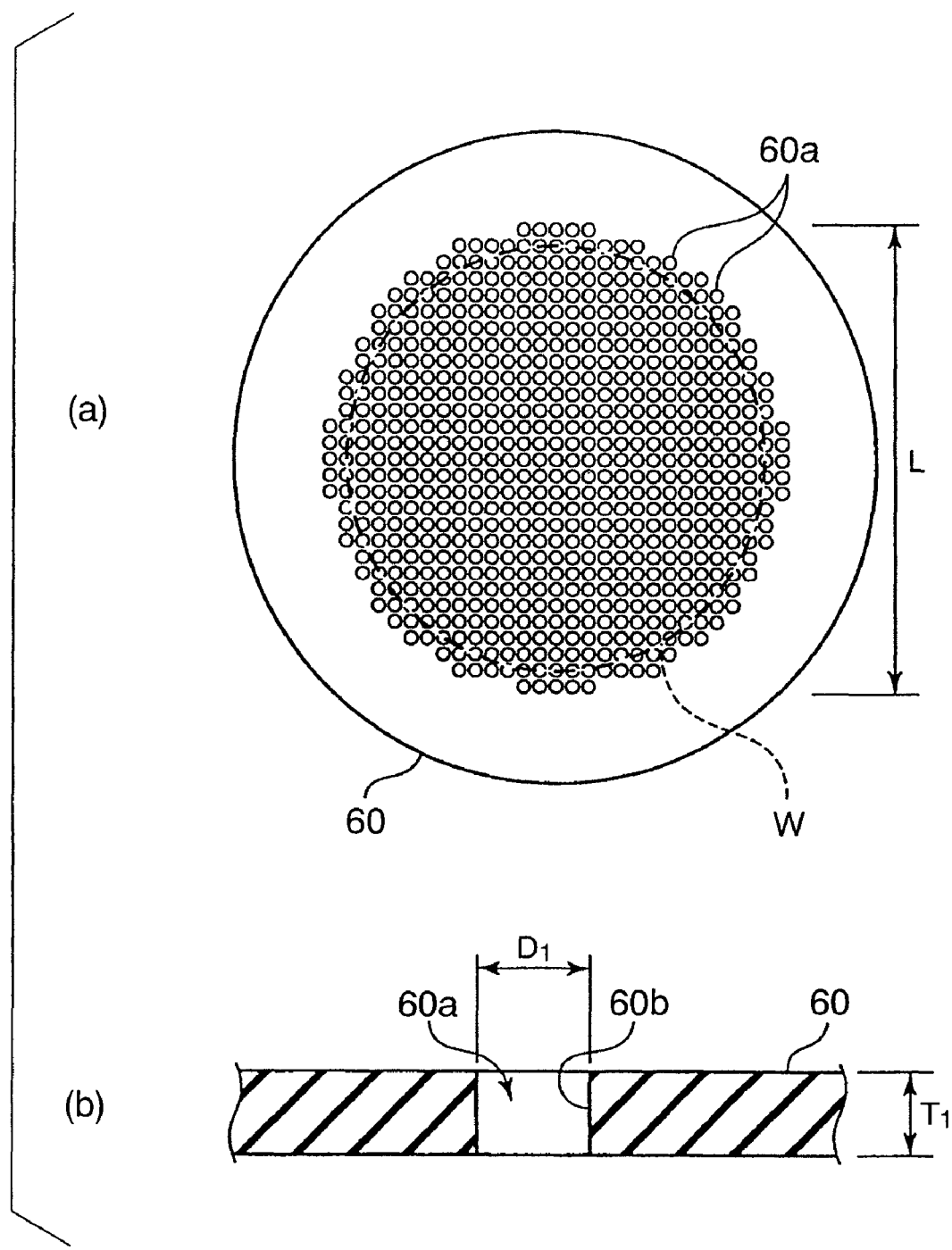
FIG. 2(a) is a plan view showing a structure of one exemplary plate having a plurality of through-holes.
FIG. 2(b) is a cross sectional view of a key portion of the plate.
Figure 8:
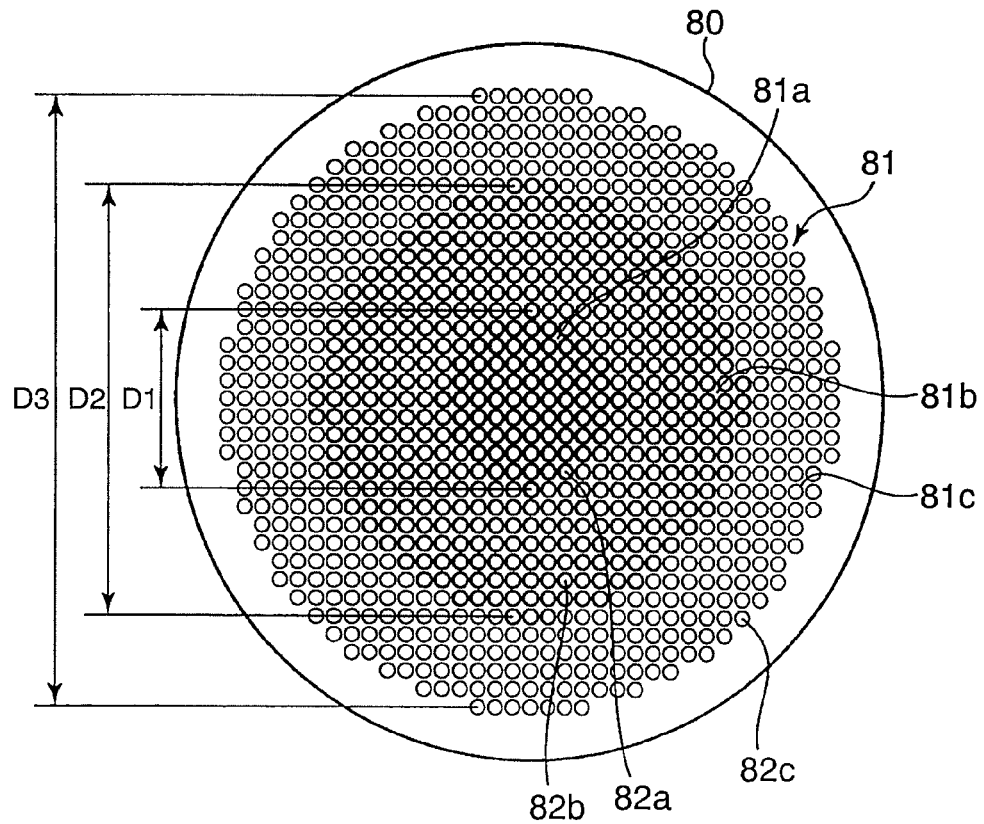
FIG. 8 is a plan view showing the structure of another example of the plate.

In the above embodiment, while the plate 60 having openings or through-holes uniformly arranged therein as shown in FIG. 2 has been used, the structure of this plate is not limited in particular to such an aspect. For instance, another plate 80 having three kinds of through-hole zones 81, respectively having different though-hole diameters, as shown in FIG. 8, may be used. Specifically, this plate 80 includes a first through-hole zone 81a provided corresponding to a central portion of the wafer W, a second through-hole zone 81b located around the first zone 81a, corresponding to the periphery of the wafer W, and a third through-hole zone 81c located around the second zone 81b and including a region somewhat outside the wafer W. Alternatively, a two-zone type plate may also be used herein.

In the case of the above three-zone type plate 80, through-holes 82a having the smallest diameter are formed in the first through-hole zone 81a, while through holes 82c having the largest diameter are formed in the third through-hole zone 81c, with the second through-hole zone 81b having through-holes 82b with a diameter of an intermediate size between such smallest and largest diameters of the through holes 82a, 82c respectively. The size suitable for each of the diameters 82a to 82c of the first to third through-hole zones 81a to 81c is preferably within a range of 5 to 15 mm, more preferably 7 to 12 mm. Additionally, it is preferred that a ratio of [(the diameter of each through-hole 82a):(the diameter of each through-hole 82b):(the diameter of each through-hole 82c)] is preferably 1:1 to 1.2:1 to 1.4.

In addition, it is preferred that with respect to the plate 80, the through-holes 82a in the first zone 81a have the smallest opening ratio, while the through-holes 82c in the third zone 81c have the greatest opening ratio, with the second zone 81b having the through-holes 82b with an intermediate opening ratio between such smallest and greatest ratios of the through holes 82a, 82c respectively. Specifically, the opening ratio of the through-holes 82a in the first zone 81a is preferably within a range of 25 to 55%, the opening ratio of the through-holes 82b in the second zone 81b is preferably within a range of 30 to 85%, and the opening ratio of the through-holes 82c in the third zone 81c is preferably within a range of 50 to 80%. Furthermore, a ratio of [(the opening ratio of the through-holes 82a in the first zone 81a):(the opening ratio of the through-holes 82b in the second zone 82a):(the opening ratio of the through-holes 82c in the third zone 82c)] is preferably within a range of 1:1 to 2.6:1.1 to 3.2.

Preferably, in the case of using a 300 mm sized wafer as the wafer W, the diameter of each through-hole 82a in the first zone 81a is within a range of 7 to 11 mm, the diameter of each through-hole 82b in the second zone 81b is within a range of 7 to 11 mm, and the diameter of each through-hole 82c in the third zone 81c is within a range of 9 to 13 mm. Furthermore, as shown in FIG. 8, it is preferred that a diameter D1 of the entire first zone 81a is within a range of 80 to 190 mm, a diameter D2 of the second zone 81b is within a range of 250 to 450 mm, and a diameter D3 of the third zone 81c is within a range of 400 to 650 mm. By providing such a plate 80, the plasma can be generated with relatively low ion energy (or plasma energy), and a substantially uniform plasma oxidation process can be provided to the whole surface of the wafer W. Thus, the silicon oxide film having the substantially uniform thickness can be formed, while the degree of rounding each corner portion of the wafer surface having the concavo-convex shape can be successfully controlled.

Figure 9:
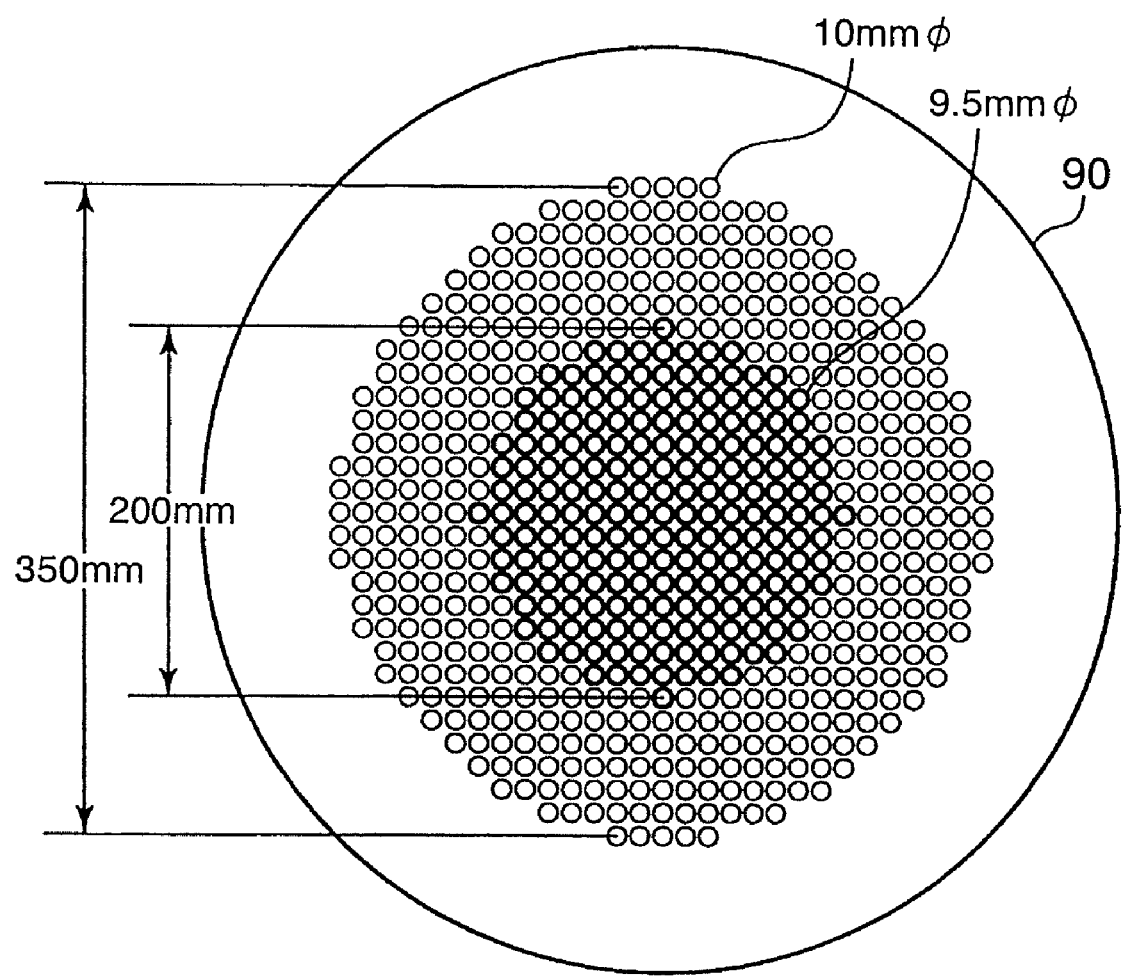
FIG. 9 is a plan view showing the structure of still another example of the plate.

As still another example of the aforementioned plate 60, a plate 90, as shown in FIG. 9 can also be used. Specifically, the plate 90 includes a 350 mm diameter zone as the through-hole zone described above, wherein a central 200 mm diameter zone thereof has 9.5 mm diameter through-holes with a 12.5 mm pitch (or 44.4% opening ratio), while an outer zone located around the central 200 mm diameter zone has 10 mm diameter through-holes arranged therein with the same 12.5 mm pitch (or 52.4% opening ratio).

Additionally, the present invention is suitable for many applications required for forming a high-quality oxide film on and along such a concavo-convex pattern as shown in FIG. 5. For instance, this invention can be applied to the formation of the oxide film in the trench used for the STI as well as applied to the formation of the oxide film on a side wall of a polysilicon gate electrode of the transistor. Furthermore, this invention is applicable to the case of forming the silicon oxide film used as the gate insulating film or the like, in a process for manufacturing a three-dimensional transistor having a particular structure, such as a fin structure or groove gate structure, in which the surface orientation dependent properties on the silicon surface is changed in a certain concavo-convex portion. Besides, this invention can also be applied to formation of a tunnel oxide film as used in the flash memory.

In the above embodiment, the method for forming the silicon oxide film used as the insulating film has been discussed. However, the silicon oxide film formed in accordance with the method of this invention may be further nitrided into a silicon oxide-nitride film (SiON film). Alternatively, this method can be used for forming a silicon nitride film by directly nitriding the silicon. While such a nitriding method is not critical herein, it is preferred that a suitable plasma nitriding process, using, for example, a mixed gas containing the Ar gas and $N_2$ gas, is employed.

Preferably, the condition for nitriding the silicon or silicon oxide film comprises the Ar flow rate of a range of 100 to 5000 sccm; $N_2$ flow rate of a range of 5 to 500 sccm [with the ratio of $N_2$/Ar being 0.001 to 5, more preferably 0.01 to 1]; processing pressure of a range of 1.3 to 133.3 Pa, more preferably 6.7 to 66.7 Pa; processing temperature of a range of 300 to 600° C.; and microwave power of a range of 0.41 to 4.19 $W/cm^2$.

While the plasma processing apparatus 100 shown in FIG. 1 has been described as one using only a single plate 60, a plurality of, e.g., two, plates 60 may be arranged in the apparatus 100, with the through-holes 60a thereof being not respectively overlapped with one another.

INDUSTRIAL APPLICABILITY

As stated above, the present invention has wide applicability for forming the silicon oxide film or silicon nitride film, in manufacturing various semiconductor devices.

What is claimed is:

1. A method for forming a silicon oxide film with a plasma processing apparatus comprising:
    a process chamber;
    a microwave transmissive plate;
    a planar antenna plate provided on the microwave transmissive plate for introducing microwaves into a region for generating plasma within the processing chamber;
    a gas introducing member for introducing a processing gas into the processing chamber; and
    a member having a plurality of through-holes provided below the planar antenna plate and between the region for generating the plasma in the processing chamber and the object to be processed,
    said method comprising the steps of:
    placing an object formed of silicon and having a concavo-convex pattern on a surface thereof, in the processing chamber; and
    forming a silicon oxide film by generating plasma of a processing gas with the microwave transmissive plate, the planar antenna plate, and the gas introducing member so as to oxidize the silicon on the surface of the object to be processed, and by applying the plasma of the processing gas to the surface,
    wherein the step of forming the silicon oxide film comprises generating the plasma under the condition that a ratio of oxygen in the processing gas is within a range of 0.1% to 10% and pressure is within a range of 0.133 Pa to 133.3 Pa, so as to oxidize the silicon, and introducing the generated plasma toward the object to be processed, via the plurality of through-holes formed in the member between the region and the object, thereby forming the silicon oxide film.

2. The method for forming the silicon oxide film with a plasma processing apparatus, according to claim 1, wherein the ratio of oxygen in the processing gas is within a range of 0.5% to 10%.

3. The method for forming the silicon oxide film with a plasma processing apparatus, according to claim 1, wherein the processing pressure is within a range of 6.6 Pa to 133.3 Pa.

4. The method for forming the silicon oxide film with a plasma processing apparatus, according to claim 1, wherein the processing gas further contains hydrogen at a ratio within a range of 0.1% to 10%.

5. The method for forming the silicon oxide film with a plasma processing apparatus, according to claim 1, wherein the processing temperature is within a range of 200° C. to 800° C., upon forming the silicon oxide film by generating the plasma of the processing gas.

6. The method for forming the silicon oxide film with a plasma processing apparatus, according to claim 1, wherein the plasma is microwave excitation plasma generated from the processing gas, with a microwave introduced into the processing chamber, via the transmissive plate, from the planar antenna having a plurality of slots.

7. The method for forming the silicon oxide film with a plasma processing apparatus, according to claim 1, wherein a diameter of each through-hole is within a range of 2.5 mm to 12 mm.

8. The method for forming the silicon oxide film with a plasma processing apparatus, according to claim 1, wherein an electron temperature of the plasma, after it passed through the through-holes, is 0.7 eV or less.

9. The method for forming the silicon oxide film with a plasma processing apparatus, according to claim 1, wherein an opening ratio of the through-holes is within a range of 10% to 20%.

10. The method for forming the silicon oxide film with a plasma processing apparatus, according to claim 1, wherein a distance between the object to be processed and the member having the through-holes formed therein is within a range of 3 mm to 20 mm.

11. The method for forming the silicon oxide film with a plasma processing apparatus, according to claim 6, wherein a distance between the member having the through-holes formed therein and the transmissive plate is within a range of 20 mm to 50 mm.

12. A plasma processing apparatus, comprising:
- a processing chamber configured to be evacuated into a vacuum state and adapted for providing a desired process to an object formed of silicon and having a concavo-convex pattern on a surface thereof;
- a processing gas supply unit adapted for supplying a processing gas into the processing chamber;
- a plasma supply source adapted for generating plasma of the processing gas in the processing chamber, so as to oxidize the silicon on the surface of the object to be processed, by applying the plasma of the processing gas to the surface, thereby forming the silicon oxide film;
- an exhaust apparatus adapted for controlling pressure in the processing chamber; and
- a control unit adapted for controlling the processing gas supply unit, plasma supply source and exhaust apparatus, respectively,
- wherein a member having a plurality of through-holes formed therein is provided between a region for generating plasma in the processing chamber and the object to be processed for dividing the processing chamber,
- wherein the control unit is configured to control the processing gas supply unit, plasma supply source and exhaust apparatus, respectively, thereby to generate the plasma under the condition that a ratio of oxygen in the processing gas is within a range of 0.1% to 10% and pressure is within a range of 0.133 Pa to 133.3 Pa, so as to oxidize the silicon, to introduce the generated plasma toward the object to be processed, via the plurality of through-holes formed in the member, thereby forming the silicon oxide film,
- wherein the region for generating the plasma includes a microwave transmissive plate and a planar antenna plate provided on the microwave transmissive plate for introducing a microwave into the processing chamber, and a gas introducing member, for introducing the processing gas into the processing chamber, and
- wherein the member having the plurality of through-holes is arranged independently of and below the planar antenna plate.

* * * * *

UNITED STATES PATENT AND TRADEMARK OFFICE
CERTIFICATE OF CORRECTION

PATENT NO.         : 7,972,973 B2
APPLICATION NO.    : 12/443137
DATED              : July 5, 2011
INVENTOR(S)        : Takashi Kobayashi et al.

It is certified that error appears in the above-identified patent and that said Letters Patent is hereby corrected as shown below:

On the Title Page, please insert

--(75) Inventors:    Takashi Kobayashi, Amagasaki (JP)
                            Toshihiko Shinozawa, Amagasaki (JP)
                            Yoshiro Kabe, Amagasaki (JP)
                            Junichi Kitagawa, Amagasaki (JP)--

Signed and Sealed this
Twenty-seventh Day of December, 2011

David J. Kappos
*Director of the United States Patent and Trademark Office*

UNITED STATES PATENT AND TRADEMARK OFFICE
CERTIFICATE OF CORRECTION

| | |
|---|---|
| PATENT NO. | : 7,972,973 B2 |
| APPLICATION NO. | : 12/443137 |
| DATED | : July 5, 2011 |
| INVENTOR(S) | : Takashi Kobayashi et al. |

Page 1 of 1

It is certified that error appears in the above-identified patent and that said Letters Patent is hereby corrected as shown below:

On the Title Page, please insert

--(75) Inventors:  Takashi Kobayashi, Amagasaki (JP)
Toshihiko Shiozawa, Amagasaki (JP)
Yoshiro Kabe, Amagasaki (JP)
Junichi Kitagawa, Amagasaki (JP)--

This certificate supersedes the Certificate of Correction issued December 27, 2011.

Signed and Sealed this
First Day of May, 2012

David J. Kappos
*Director of the United States Patent and Trademark Office*